United States Patent
Shur et al.

(10) Patent No.: US 8,698,127 B2
(45) Date of Patent: Apr. 15, 2014

(54) SUPERLATTICE STRUCTURE AND METHOD FOR MAKING THE SAME

(75) Inventors: Michael Shur, Latham, NY (US);
Remigijus Gaska, Columbia, SC (US);
Jinwei Yang, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 33 days.

(21) Appl. No.: 12/987,102

(22) Filed: Jan. 8, 2011

(65) Prior Publication Data
US 2011/0168979 A1 Jul. 14, 2011

Related U.S. Application Data

(60) Provisional application No. 61/293,614, filed on Jan. 8, 2010.

(51) Int. Cl.
| | |
|---|---|
| *H01L 33/00* | (2010.01) |
| *H01L 29/06* | (2006.01) |
| *H01L 21/00* | (2006.01) |
| *H01L 33/06* | (2010.01) |
| *H01L 21/02* | (2006.01) |
| *H01L 33/32* | (2010.01) |
| *H01L 29/15* | (2006.01) |

(52) U.S. Cl.
CPC .......... *H01L 33/06* (2013.01); *H01L 21/02507* (2013.01); *H01L 33/32* (2013.01); *H01L 29/15* (2013.01)
USPC .................... 257/18; 257/94; 257/98; 438/22

(58) Field of Classification Search
CPC ... H01L 33/06; H01L 33/32; H01L 21/02507; H01L 21/02387; H01L 29/15
USPC ................ 257/13–15, 18, 21, 94, 98; 438/22
See application file for complete search history.

(56) References Cited

U.S. PATENT DOCUMENTS

| | | | |
|---|---|---|---|
| 6,943,381 B2 * | 9/2005 | Gardner et al. ............... 257/103 |
| 7,956,369 B2 * | 6/2011 | Reed et al. ...................... 257/94 |
| 8,299,452 B2 * | 10/2012 | Sato et al. ....................... 257/13 |
| 2002/0179923 A1 * | 12/2002 | Morita et al. ................. 257/103 |
| 2004/0159851 A1 | 8/2004 | Edmond et al. |
| 2006/0118822 A1 | 6/2006 | Murata et al. |
| 2009/0310640 A1 * | 12/2009 | Sato et al. ................ 372/45.011 |
| 2011/0001123 A1 | 1/2011 | Kim et al. |
| 2011/0017974 A1 * | 1/2011 | Ahn ............................... 257/13 |
| 2011/0017976 A1 | 1/2011 | Khan et al. |
| 2011/0140079 A1 | 6/2011 | Jang et al. |
| 2011/0168979 A1 | 7/2011 | Shur et al. |
| 2013/0292638 A1 | 11/2013 | Shur et al. |

OTHER PUBLICATIONS

Marcinkevicius et al., "Intrinsic Electric Fields in AlGaN Quantum Wells", Applied Physics Letters 90, 081914, Copyright 2007, 3 pages.

(Continued)

*Primary Examiner* — Shouxiang Hu
(74) *Attorney, Agent, or Firm* — LaBatt, LLC

(57) ABSTRACT

A superlattice layer including a plurality of periods, each of which is formed from a plurality of sub-layers is provided. Each sub-layer comprises a different composition than the adjacent sub-layer(s) and comprises a polarization that is opposite a polarization of the adjacent sub-layer(s). In this manner, the polarizations of the respective adjacent sub-layers compensate for one another.

24 Claims, 5 Drawing Sheets

(56) References Cited

OTHER PUBLICATIONS

Kuokstis et al., "Polarization Effects and UV Emission in Highly Excited Quaternary AlInGaN Quantum Wells", Phys. Stat. Sol. (b) 228, No. 2, pp. 559-562, Copyright 2001.

Park, International Search Report and Written Opinion for International Application No. PCT/US2013/031257, Jun. 28, 2013, 12 pages.

Hu, USPTO Office Action for U.S. Appl. No. 13/162,895, Jan. 28, 2014, 25 pages.

\* cited by examiner

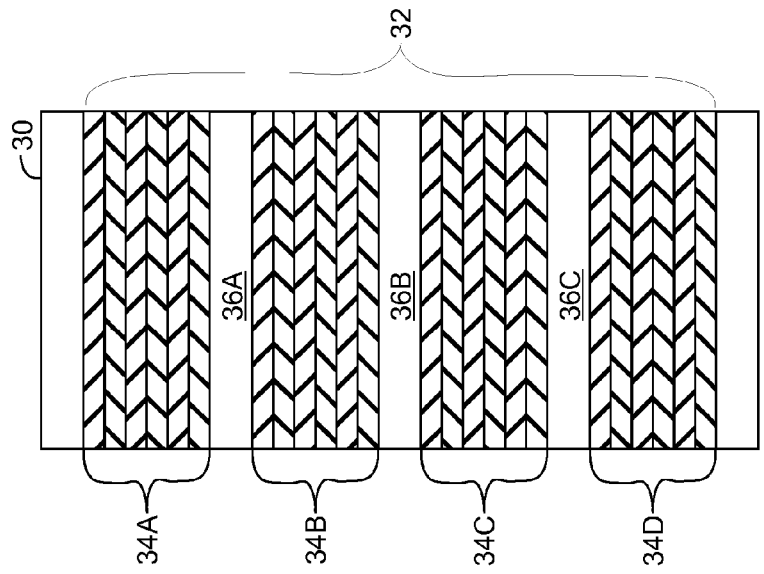
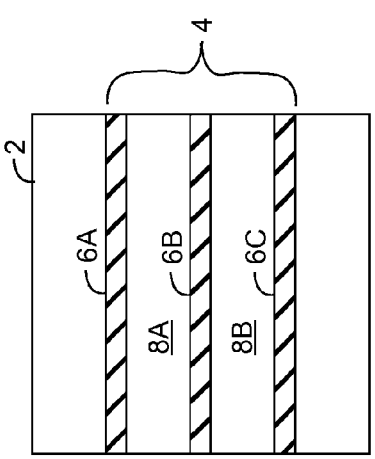
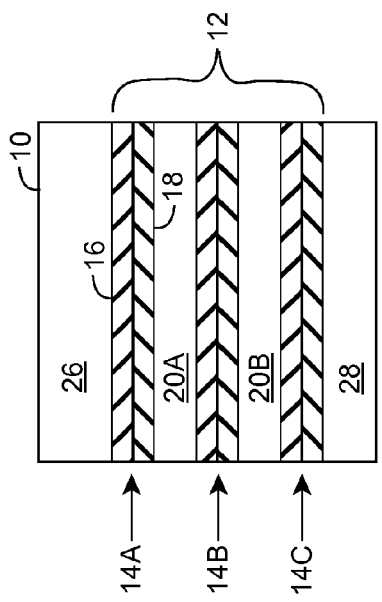

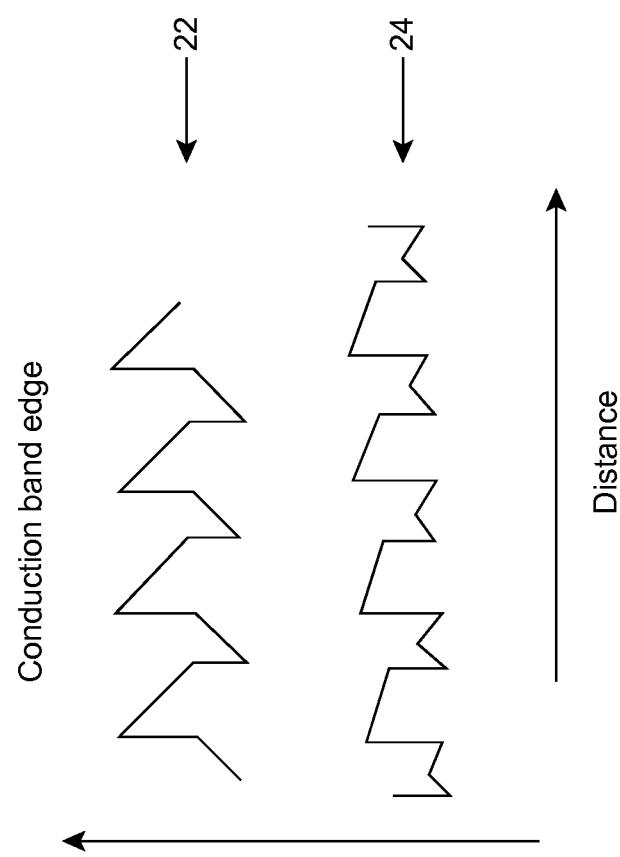

SUPERLATTICE STRUCTURE AND METHOD FOR MAKING THE SAME

REFERENCE TO PRIOR APPLICATIONS

The current application claims the benefit of U.S. Provisional Application No. 61/293,614, titled "Superlattice Structures and Devices," which was filed on 8 Jan. 2010, and which is hereby incorporated by reference.

GOVERNMENT LICENSE RIGHTS

The U.S. Government has a paid-up license in this invention and the right in limited circumstances to require the patent owner to license others on reasonable terms as provided for by the terms of the Grant No. IIP-0839492 awarded by the National Science Foundation.

TECHNICAL FIELD

The disclosure relates generally to semiconductor devices, and more particularly, to a superlattice structure configured to reduce polarization effects of the semiconductor materials forming the devices.

BACKGROUND ART

In nitride based semiconductor materials and devices, including visible and ultraviolet (UV) light emitting diodes (LEDs), polarization effects play a dominant role causing strong built-in fields and spatial separation of electrons and holes. These polarization effects can negatively impact the performance of nitride-based visible and ultraviolet light emitting diodes. For example, FIGS. 1A-1C show illustrative band diagrams of a positive-intrinsic-negative (p-i-n) quantum well structure according to the prior art. In particular, FIG. 1A shows a band diagram of the structure without external bias and illumination; FIG. 1B shows a band diagram of the structure with the p-i-n field compensated by external bias; and FIG. 1C shows a band diagram of the structure with the total electric field compensated by external bias and intense optical excitation.

Polarization effects were evaluated for illustrative aluminum indium gallium nitride-based ($Al_xIn_yGa_{1-x-y}N$-based) multiple quantum well (MQW) structures. The MQW structures comprise an Al molar fraction in the quantum wells and barrier layers close to 20% and 40%, respectively, and In content in both the quantum wells and barriers of approximately 2% and 1%, respectively. The MQW structures comprise a total of four wells, each of which is four nanometers thick, separated by five nanometer thick barriers.

Calculations indicated that the barriers and wells undergo tensions of 0.815% and 0.314%, respectively. These tensions correspond to piezoelectric charges at interfaces induced by this mismatch of $-0.0484$ coulombs per meter squared ($C/m^2$) for the well and $-0.0134$ $C/m^2$ for the barrier. The polarization charge was calculated as $-0.041$ $C/m^2$ and $-0.049$ $C/m^2$ for the wells and barriers, respectively. The total electric field in the well for an alternating sequence of barriers and wells was found to be 1.2 Megavolts per centimeter (MV/cm). About fifty percent of the field was due to piezoelectric effect and the remaining fifty percent was caused by spontaneous polarization, both having the same direction. This corresponds to a 0.12 eV band bending in a one nanometer wide quantum well. Such band bending precludes using wide quantum wells in deep UV LEDs, which decreases the overall LED efficiency by limiting the MQW design optimization to very narrow (i.e., one to two nanometer thick) quantum wells.

SUMMARY OF THE INVENTION

Aspects of the invention provide a superlattice layer including a plurality of periods, each of which is formed from a plurality of sub-layers. Each sub-layer comprises a different composition than the adjacent sub-layer(s) and comprises a polarization that is opposite a polarization of the adjacent sub-layer(s). In this manner, the polarizations of the respective adjacent sub-layers compensate for one another. The superlattice layer can be incorporated in various types of devices, and can allow for, for example, utilization of much wider quantum wells by avoiding the detrimental confined Stark effect, which prevents efficient radiative recombination.

A first aspect of the invention provides a structure comprising: a superlattice layer including a plurality of periods, each of the plurality of periods including: a first sub-layer having a first composition and a first polarization; and a second sub-layer adjacent to the first sub-layer, the second sub-layer having a second composition distinct from the first composition and a second polarization opposite the first polarization.

A second aspect of the invention provides a method comprising: creating a structure design for a device, the structure design including a superlattice layer comprising a plurality of periods, the creating the structure design including: selecting a first composition having a first polarization for a first sub-layer of each of the plurality of periods; and selecting a second composition having a second polarization for a second sub-layer of each of the plurality of periods, wherein the second sub-layer is adjacent to the first sub-layer, and wherein the second composition is distinct from the first composition and the second polarization is opposite the first polarization.

A third aspect of the invention provides a group III nitride-based device comprising: a superlattice layer including a plurality of periods, each of the plurality of periods including: a first sub-layer having a first group III nitride-based composition and a first polarization; and a second sub-layer adjacent to the first sub-layer, the second sub-layer having a second group III nitride-based composition distinct from the first composition and a second polarization opposite the first polarization, wherein the first polarization and the second polarization comprise at least one of: a strain-induced polarization or a spontaneous polarization.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 2A and 2B show illustrative structures according to the prior art and an embodiment, respectively.

FIG. 3 shows a conduction band diagram comparing a conduction band profile for a conventional quantum well and a conduction band profile for a quantum well according to an embodiment.

FIG. 4 shows another illustrative structure according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1A:
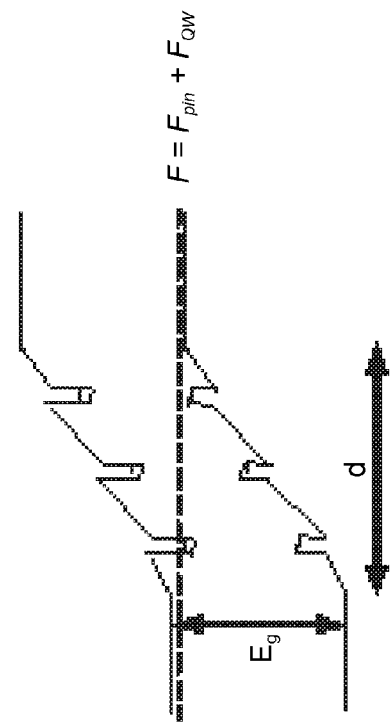
FIGS. 1A-1C show illustrative band diagrams of a p-i-n quantum well structure according to the prior art.
Figure 1C:
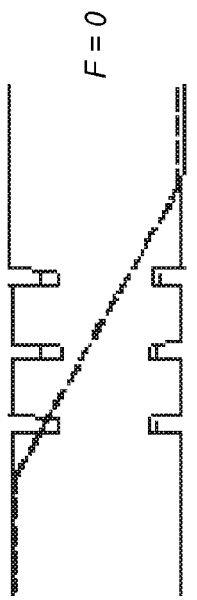
Figure 1B:
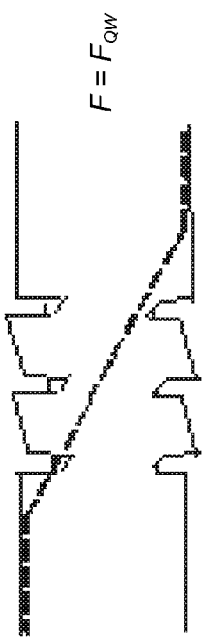

As indicated above, aspects of the invention provide a superlattice layer including a plurality of periods, each of which is formed from a plurality of sub-layers. Each sub-layer comprises a different composition than the adjacent sub-layer(s) and comprises a polarization that is opposite a polarization of the adjacent sub-layer(s). In this manner, the polarizations of the respective adjacent sub-layers compensate for one another. The superlattice layer can be incorporated in various types of devices, and can allow for, for example, utilization of much wider quantum wells by avoiding the detrimental confined Stark effect, which prevents efficient radiative recombination. As used herein, unless otherwise noted, the term "set" means one or more (i.e., at least one) and the phrase "any solution" means any now known or later developed solution.

Turning to the drawings, FIGS. 2A and 2B show illustrative structures 2, 10 according to the prior art and an embodiment, respectively. As illustrated in FIG. 2A, structure 2 includes a superlattice layer 4, which includes a plurality of repeating sub-layers 6A-6C. Each sub-layer 6A-6C can be separated from another sub-layer by a second set of sub-layers 8A-8B in the superlattice layer 4. Superlattice structure 4 can be configured to perform any type of function as part of a device incorporating structure 2. For example, sub-layers 6A-6B can comprise a set of quantum wells and sub-layers 8A-8B can comprise a set of barriers. In this case, superlattice layer 4 can comprise a multiple quantum well structure.

As shown in FIG. 2B, an embodiment of the invention provides a structure 10 including a superlattice layer 12 that is configured, for example, to reduce polarization effects. In particular, the superlattice layer 12 includes multiple periods 14A-14C, each of which includes two or more sub-layers 16, 18 having different compositions. Adjacent sub-layers 16, 18 in each period 14A-14C are configured to have polarizations (e.g., built-in electric fields) that at least partially cancel one another. For example, sub-layer 16 can comprise a spontaneous polarization having an opposite sign as a spontaneous polarization of sub-layer 18. Similarly, sub-layer 16 can comprise a strain-induced polarization having an opposite sign of a strain-induced polarization of sub-layer 18. Still further, one type of polarization in sub-layer 16 can have an opposite sign of another type of polarization in sub-layer 18, thereby reducing the net polarization present due to a combination of multiple types of polarizations (e.g., spontaneous and strain-induced).

In an embodiment, sub-layer 16 can comprise a positive or negative spontaneous polarization, while sub-layer 18 comprises the other of the positive or negative spontaneous polarization. In a more particular embodiment, the absolute values of the spontaneous polarizations of sub-layers 16, 18 are substantially equal, so that the net spontaneous polarization for the period 14A-14C is close to zero. In another embodiment, sub-layer 16 can comprise a strain-induced (e.g., piezoelectric) polarization due to stretching or compression, while sub-layer 18 comprises a strain-induced polarization due to the other of stretching or compression. In a more particular embodiment, the absolute values of the strain-induced polarizations of sub-layers 16, 18 are substantially equal, so that the net strain-induced polarization for the period 14A-14C is close to zero. It is understood that the respective spontaneous and/or strain-induced polarizations of sub-layers 16, 18 can be configured to only partially reduce the net spontaneous and/or strain-induced polarization for the period 14A-14C.

In still another embodiment, the spontaneous and/or strain-induced polarization of one sub-layer 16, 18 is configured to at least partially compensate the other of the spontaneous and/or strain-induced polarization of the other sub-layer 16, 18. For example, sub-layer 16 can comprise a spontaneous polarization of a first sign, and sub-layer 18 can comprise a strain-induced polarization of the opposite sign. In this case, the net polarization for the period 14A-14C will be reduced due to the two types of polarizations of the sub-layers 16, 18 compensating one another.

The various periods 14A-14C in superlattice layer 12 can be separated from one another by a set of additional sub-layers 20A-20B. In an embodiment sub-layers 20A-20B comprise inactive layers having no polarization. In another embodiment, each period 14A-14C comprises a quantum well, while each sub-layer 20A-20B comprises a barrier. In this case, superlattice layer 12 comprises a multiple quantum well structure. The periods (e.g., quantum wells) 14A-14C in superlattice layer 12 can be wider than the conventional sub-layers (e.g., quantum wells) 6A-6C. For example, in an embodiment, the width of superlattice layer 12 can be greater than two nanometers. In a more particular embodiment, the width of superlattice layer 12 is between approximately three nanometers and eight nanometers. In particular, periods 14A-14C will comprise a much smaller polarization field than that of a conventional sub-layer 6A-6C of a similar width. As a result, the detrimental confined Stark effect is avoided, which separates electrons and holes within a quantum well and prevents efficient radiative recombination.

FIG. 3 shows a conduction band diagram comparing a conduction band profile 22 for a conventional quantum well 6A (FIG. 2A) and a conduction band profile 24 for a quantum well 14A (FIG. 2B) according to an embodiment. As illustrated, the conduction band profile 24 comprises a more shallow profile than that of the conduction band profile 22. As a result, electrons in quantum well 14A can spread out within the quantum well 14A more than the electrons in quantum well 6A, providing for a more efficient radiative recombination.

Returning to FIG. 2B, superlattice 12 can perform any function as part of a device formed using structure 10. To this extent, superlattice 12 is located between a first layer 26 and a second layer 28 of the structure 10. In an illustrative embodiment, first layer 26 and second layer 28 can be formed from two dissimilar materials (e.g., two dissimilar nitride based semiconductor materials), and superlattice 12 can be graded in such a manner that it compensates (e.g., reduces) strain exerted by the dissimilar materials of layers 26, 28. For example, the lattice structure of each sub-layer 16, 18 of superlattice 12 can gradually change from a lattice structure similar to first layer 26 to a lattice structure similar to second layer 28.

While periods 14A-14C are each shown including two sub-layers 16, 18. It is understood that each period 14A-14C can include any number of sub-layers 16, 18. Similarly, while superlattice layer 12 is shown including three periods 14A-14C, it is understood that superlattice layer 12 can include any number of two or more periods 14A-14C. For example, FIG. 4 shows another illustrative structure 30 according to an embodiment. Structure 30 includes a superlattice layer 32, which comprises four periods 34A-34D that are separated by three sub-layers 36A-36C. Each period 34A-34D is formed by a set of six sub-layers of alternating compositions and polarizations. To this extent, each sub-layer of each period 34A-34D is immediately adjacent to one or two sub-layers having a different composition and an opposite polarization (e.g., spontaneous and/or strain-induced as described herein). In this manner, the periods 34A-34D can be made even wider than the conventional sub-layers 6A-6C of the prior art with smaller polarization fields than a conventional sub-layer 6A-6C of a similar thickness.

In an embodiment, structures 10 (FIG. 2B) and 30 (FIG. 4) can comprise nitride-based heterostructures. In a more specific embodiment, the structures 10, 30 comprise group III nitride-based heterostructures. In this case, the periods 14A-14C, 34A-34D of each structure 10, 30, respectively, each can be formed of group III nitride materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements. In an even more specific embodiment, the sub-layers described herein are quaternary or ternary group III nitride sub-layers, such as such as AlInN, AlGaN, InGaN, or AlInGaN. For further strain and/or polarization reduction, one or more sub-layers 16, 18 forming each period 14A-14C, 34A-34D can be doped. The sub-layers 16, 18 can be doped p-type or n-type. Furthermore, a sub-layer 16, 18 can comprise a monolayer.

Figure 5:
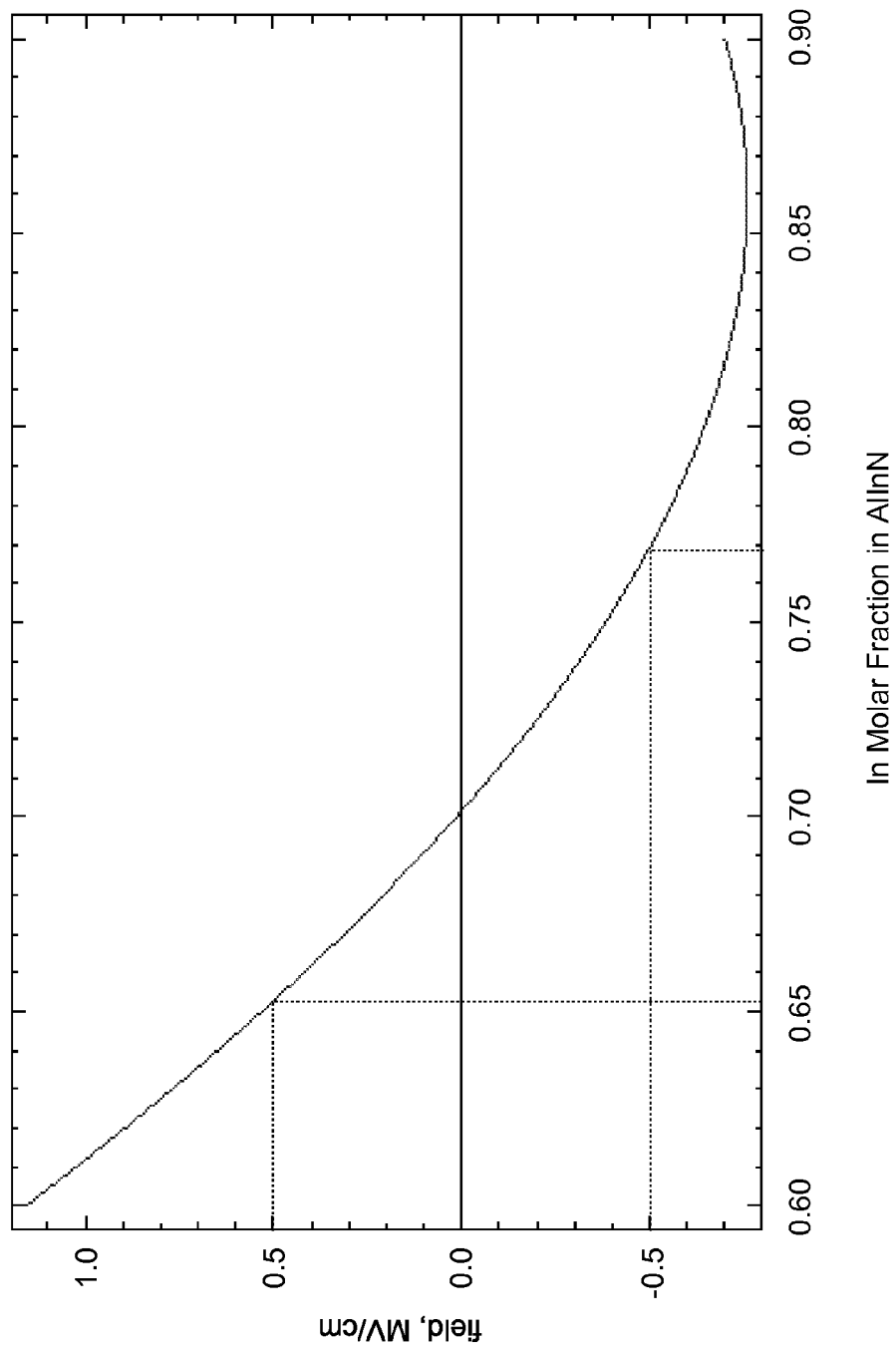
FIG. 5 shows a chart of a calculated electric field at a heterointerface between gallium nitride (GaN) and aluminum indium nitride (AlInN) as a function of the indium molar fraction in the AlInN according to an embodiment.

FIG. 5 shows a chart of a calculated electric field at a heterointerface between gallium nitride (GaN) and aluminum indium nitride (AlInN) as a function of the indium molar fraction in the AlInN according to an embodiment. As illustrated, the calculated electric field drops to zero and goes negative as the indium molar fraction exceeds 0.7. In an illustrative embodiment, each sub-layer 16, 18 comprises AlInN with differing molar fractions of In. For example, sub-layer 16 can comprise an In molar fraction of approximately 0.65, which results in a calculated electric field of approximately 0.5 MV/cm, and sub-layer 18 can comprise an In molar fraction of approximately 0.77, which results in a calculated electric field of approximately −0.5 MV/cm. In this manner, the electric fields of both sub-layers 16, 18 can substantially cancel one another.

The superlattices 12, 32 described herein can be implemented as part of structures 10, 30 utilized for various types of devices, e.g., which are fabricated using semiconductor materials where polarization effects play a role. A superlattice 12, 32 described herein can be utilized as, for example, a multiple quantum well, an integral part of an ohmic and/or Schottky contact, a cladding layer, a buffer layer, a barrier layer, and/or the like, for the device. In an illustrative embodiment, structure 10 comprises a p-type contact including superlattice 12 and a metal layer 26 located thereon.

A structure 10, 30 described herein can be implemented as part of, for example, a light emitting device, such as a light emitting diode (LED) or laser. The light emitting device can comprise a visible light emitting device, an ultraviolet light emitting device, and/or the like. In this case, the light emitting device can include one or more superlattices as cladding layer(s), ohmic contact(s), and/or the like. In a more particular embodiment, the superlattice is formed as part of an ohmic contact for an ultraviolet light emitting device where a top p-type contact layer of the ohmic contact, which is transparent to ultraviolet radiation, is located directly on the superlattice 12, 32. In a still more particular embodiment, the top p-type contact layer comprises AlInN.

Similarly, structures 10, 30 described herein can be incorporated as part of, for example, a transistor (e.g., a field effect transistor), a photodetector, a monolithic and/or optoelectronic integrated circuit, a metal-semiconductor diode, a p-n junction diode, a switch, and/or the like. In this case, the device can include one or more superlattices as buffer layer(s), barrier layer(s), contact layer(s), and/or the like. In a more particular embodiment, the periods of the superlattice layer are formed from AlInN.

While shown and described herein with respect to the fabrication of a superlattice layer, it is understood that an embodiment of the invention can be applied to the fabrication of a heterostructure comprising a set of quantum wells and a set of barriers. The various sub-layers shown and described herein can be formed using any solution. For example, the superlattice layers 12, 32 can be grown using a combination of metallo organic chemical vapor deposition (MOCVD) and/or migration enhanced MOCVD (MEMOCVD), in which each period in the superlattice layer 12, 32 requires at least two growth steps.

While shown and described herein as a method of designing and/or fabricating a structure and/or a corresponding semiconductor device including the structure, it is understood that aspects of the invention further provide various alternative embodiments. For example, in one embodiment, the invention provides a method of designing and/or fabricating a circuit that includes one or more of the semiconductor devices designed and fabricated as described herein (e.g., including one or more superlattice layers 12, 32).

Figure 6:
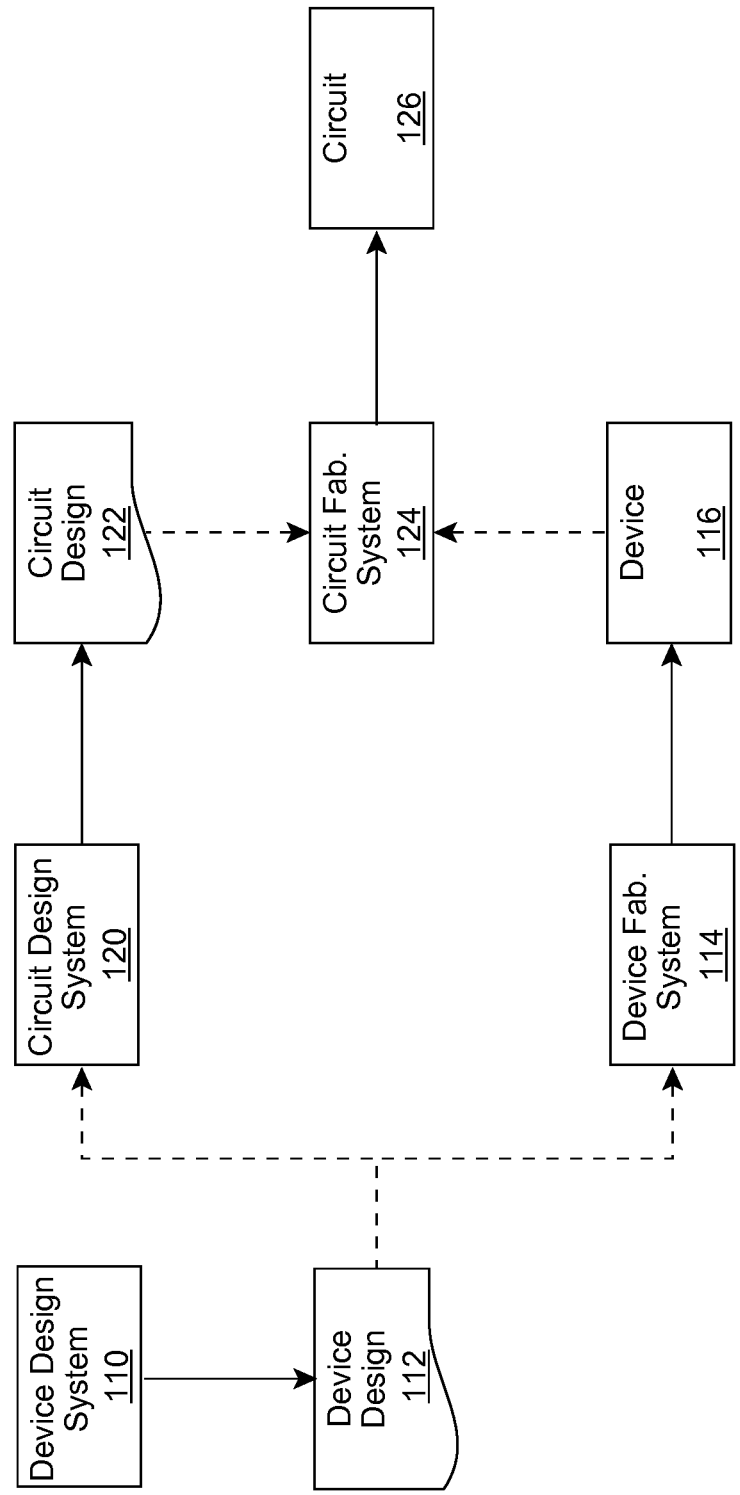
FIG. 6 shows an illustrative flow diagram for fabricating a circuit according to an embodiment.

To this extent, FIG. 6 shows an illustrative flow diagram for fabricating a circuit 126 according to an embodiment. Initially, a user can utilize a device design system 110 to generate a device design 112 using a method described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed using a method described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed using a method described herein.

In another embodiment, the invention provides a device design system 110 for designing and/or a device fabrication system 114 for fabricating a semiconductor device 116 by using a method described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated using a method described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A structure comprising:
   a superlattice layer including:
   a plurality of barriers; and
   a plurality of periods alternating with the plurality of barriers, each of the plurality of periods including:
   a first sub-layer having a first composition and a first net polarization; and
   a second sub-layer adjacent to the first sub-layer, the second sub-layer having a second composition distinct from the first composition and a second net polarization opposite the first net polarization such that a conduction band energy level on a first side of the period adjacent a barrier in the plurality of barriers is approximately equal to a conduction band energy level on a second side of the period opposite the first side.

2. The structure of claim 1, wherein both the first and second net polarizations include at least one of: opposite spontaneous polarizations or opposite strain-induced polarizations.

3. The structure of claim 1, wherein a strain-induced polarization between the first composition and the second composition in at least one of: the first sub-layer or the second sub-layer is opposite a spontaneous polarization of the at least one of: the first sub-layer or the second sub-layer.

4. The structure of claim 1, wherein one of the first sub-layer or the second sub-layer comprises a doped p-type sub-layer.

5. The structure of claim 1, wherein one of the first sub-layer or the second sub-layer comprises a doped n-type sub-layer.

6. The structure of claim 1, wherein at least one of the first sub-layer or the second sub-layer comprises a monolayer.

7. The structure of claim 1, further comprising:
   a first layer adjacent to a first side of the superlattice layer; and
   a second layer adjacent to a second side of the superlattice layer, wherein the second side is opposite the first side and the first layer and the second layer comprise dissimilar materials, and wherein the superlattice layer comprises a graded composition configured to compensate for strain exerted by the dissimilar materials.

8. The structure of claim 1, wherein at least one of the first sub-layer or the second sub-layer is formed using a group III nitride-based material.

9. The structure of claim 8, wherein each of the first sub-layer and the second sub-layer is formed using distinct compositions of aluminum indium nitride (AlInN).

10. The structure of claim 1, further comprising a p-type contact, the p-type contact comprising:
    the superlattice layer, wherein one of the first sub-layer or the second sub-layer comprises a doped p-type sub-layer; and
    a metal layer adjacent to the superlattice layer.

11. The structure of claim 1, wherein the structure comprises a heterostructure device configured to operate as at least one of: a light emitting diode or a laser, and wherein at least one of: a cladding layer or an ohmic contact includes the superlattice layer.

12. The structure of claim 1, wherein the structure comprises a heterostructure device configured to operate as at least one of: a transistor, a photodetector, a monolithic electronic integrated circuit, a monolithic optoelectronic integrated circuit, a metal-semiconductor diode, or a p-n junction diode, and wherein at least one of: a buffer layer, a barrier layer, or a contact layer in the heterostructure device includes the superlattice layer.

13. The structure of claim 1, further comprising an ohmic contact, the ohmic contact comprising:
    the superlattice layer; and
    a p-type contact layer adjacent to the superlattice layer, wherein the structure comprises a heterostructure device configured to operate as an ultraviolet light emitting diode, and wherein the p-type contact layer is at least partially transparent or semi-transparent or transparent to ultraviolet radiation.

14. The structure of claim 13, wherein the p-type contact layer is aluminum indium nitride (AlInN).

15. The structure of claim 13, wherein the p-type contact layer is at least partially transparent or semi-transparent or transparent to the ultraviolet radiation emitted by the heterostructure device.

16. The structure of claim 1, wherein each of the plurality of periods is a quantum well.

17. A method comprising:
creating a structure design for a device, the structure design including a superlattice layer comprising a plurality of barriers and a plurality of periods alternating with the plurality of barriers, the creating the structure design including:
selecting a first composition having a first net polarization for a first sub-layer of each of the plurality of periods; and
selecting a second composition having a second net polarization for a second sub-layer of each of the plurality of periods, wherein the second sub-layer is adjacent to the first sub-layer, and wherein the second composition is distinct from the first composition and the second net polarization is opposite the first net polarization such that a conduction band energy level on a first side of the period adjacent a barrier in the plurality of barriers is approximately equal to a conduction band energy level on a second side of the period opposite the first side.

18. The method of claim 17, wherein both the first and second net polarizations include at least one of: opposite spontaneous polarizations or opposite strain-induced polarizations.

19. The method of claim 17, wherein a strain-induced polarization between the first composition and the second composition in at least one of: the first sub-layer or the second sub-layer is opposite a spontaneous polarization of the at least one of: the first sub-layer or the second sub-layer.

20. The method of claim 17, wherein the first and second compositions comprise distinct compositions of aluminum indium nitride (AlInN).

21. The method of claim 17, further comprising fabricating at least one device according to the structure design.

22. The method of claim 21, the fabricating including growing the superlattice layer according to the structure design, the growing including growing each of the plurality of periods using a first growth step for the first sub-layer and a second growth step for the second sub-layer.

23. A group III nitride-based device comprising:
a superlattice layer including:
a plurality of barriers; and
a plurality of periods alternating with the plurality of barriers, each of the plurality of periods including:
a first sub-layer having a first group III nitride-based composition and a first net polarization; and
a second sub-layer adjacent to the first sub-layer, the second sub-layer having a second group III nitride-based composition distinct from the first composition and a second net polarization opposite the first polarization such that a conduction band energy level on a first side of the period adjacent a barrier in the plurality of barriers is approximately equal to a conduction band energy level on a second side of the period opposite the first side.

24. The device of claim 23, wherein the first and second group III nitride-based compositions comprise distinct compositions of aluminum indium nitride (AlInN).

* * * * *